United States Patent [19]
Ko et al.

[11] Patent Number: 5,484,743
[45] Date of Patent: Jan. 16, 1996

[54] SELF-ALIGNED ANTI-PUNCHTHROUGH IMPLANTATION PROCESS

[75] Inventors: Joe Ko; Chen-Chiu Hsue, both of Hsin-chu, Taiwan

[73] Assignee: United Microelectronics Corporation, Hsinchu, Taiwan

[21] Appl. No.: 394,587

[22] Filed: Feb. 27, 1995

[51] Int. Cl.$^6$ .................................................. H01L 21/265
[52] U.S. Cl. ............................................. 437/44; 437/45
[58] Field of Search ................................ 437/45, 40 RG, 437/41 RG, 44, 41 CS; 257/314, 315, 316, 344, 408

[56] References Cited

U.S. PATENT DOCUMENTS

| | | | |
|---|---|---|---|
| 5,073,512 | 12/1991 | Yoshino | 437/45 |
| 5,082,794 | 1/1992 | Pfiester et al. | 437/44 |
| 5,175,119 | 12/1992 | Matsutani | 437/44 |
| 5,219,777 | 6/1993 | Kang | 437/44 |
| 5,374,574 | 12/1994 | Kwon | 437/45 |
| 5,429,956 | 7/1995 | Shell et al. | 437/44 |

OTHER PUBLICATIONS

"A 15 μm CMOS with High Reliability and Performance" in IEDM, Nov. 1993, pp. 883–886.
"Source–to–Drain Nonuniformly Doped Channel (NDUC) MOSFET Structures for High Current Drivability and Threshold Voltage Controllability", IEEE Transactions on Electron Devices, vol. 39, No. 11, Nov. 1992, pp. 2541–2552.

*Primary Examiner*—George Fourson
*Assistant Examiner*—Brian K. Dutton
*Attorney, Agent, or Firm*—George O. Saile; Larry Prescott

[57] ABSTRACT

The invention relates to a method of forming an improved MOSFET device structure for use in ultra large scale integration devices. A local self-aligned anti-punchthrough region is formed directly under the gate electrode using ion implantation. The local anti-punchthrough region reduces the expansion of the depletion region in the channel and thereby increases the punchthrough voltage. The local anti-punchthrough region is self-aligned with the gate electrode and source/drain region so that critical spacings are maintained even for sub micron devices. Channel mobility is not degraded and the source and drain junction capacitances are reduced. The invention can be used in either N channel or P channel MOSFET devices, and in either LDD (light doped drain) or non-LDD devices.

17 Claims, 4 Drawing Sheets

5,484,743

SELF-ALIGNED ANTI-PUNCHTHROUGH IMPLANTATION PROCESS

RELATED PATENT APPLICATION (1) Ser. No. 08/275,267, filed Jul. 15, 1994, entitled "Local Punchthrough Stop for Ultra Large Scale Integration Devices," assigned to the same assignee.

BACKGROUND OF THE INVENTION (1) Field of the Invention

The invention relates to a method of forming an improved MOSFET device structure for use in ultra large scale integration devices. A local self-aligned anti-punchthrough region is formed directly under the gate electrode using ion implantation. The anti-punchthrough region reduces the expansion of the depletion region in the channel and thereby increases the punchthrough voltage. The local anti-punchthrough region is self-aligned with the gate electrode and source/drain region so that critical spacings are maintained even for sub micron devices. The source and drain junction capacitances are also reduced. The invention can be used in either N channel or P channel MOSFET devices.

(2) Description of the Related Art

In using field effect transistors in the formation of ultra large scale integrated circuit devices device punchthrough has become an increasing problem. Punchthrough ion implantations have been used near the source and drain to reduce the depletion width in the channel thereby increasing the punchthrough voltage. These methods have had the problem of increasing the source and drain capacitance and reducing channel mobility. This invention provides new methods of forming a local anti-punchthrough implant region which is self-aligned with the source/drain implantations and the gate electrode. The local anti-punchthrough implant region maintains channel mobility and minimizes junction capacitance. Self-alignment maintains critical spacings helping to minimize source and drain junction capacitances.

Hot carrier reliability and performance of 0.15 micron CMOSFETs are discussed in a paper by Takeuchi et al, "0.15 um CMOS with High Reliability and Performance" in IEDM, November 1993, Pages 883–886. Non uniformly doped channels are discussed in a paper by Okumura et al, "Source-to-Drain Nonuniformly Doped Channel (NDUC) MOSFET Structures for High Current Drivability and Threshold Voltage Controllability," IEEE Transactions on Electron Devices, Vol 39, No. 11, November 1992, Pages 2541–2552.

SUMMARY OF THE INVENTION

It is a principle object of the invention to provide a method of forming a local anti-punchthrough region for field effect transistors, or MOSFETs, used in ultra large scale integration devices which will increase the punch through voltage.

This objective is achieved by using ion implantation to increase the substrate charge concentration in a region directly below the gate electrode forming a local anti-punch through region. The anti-punchthrough region is self-aligned with the gate electrode by forming a gate electrode opening having sidewalls in a nitride layer. The nitride layer is formed over a polysilicon layer. An oxide spacer is formed on the sidewalls of the gate electrode opening. The anti-punchthrough region is then formed using an ion implant beam through the gate electrode opening in the nitride layer. The oxide spacer controls the width of the anti-punchthrough region. The oxide spacer is then stripped and a layer of polysilicon oxide or $TiSi_2$ is formed on the polysilicon through the gate electrode opening in the nitride layer. The nitride layer is then removed and the polysilicon gate electrode is formed by etching away that part of the polysilicon layer not covered by the layer of polysilicon oxide or $TiSi_2$. The formation of the anti-punchthrough region, the oxide spacer, and the gate electrode are self-aligned to the gate electrode opening in the nitride layer. The oxide spacer controls the width of the anti-punchthrough region and insures that the anti-punchthrough region will be centered with respect to the gate electrode.

The self-aligned anti-punchthrough region reduces the expansion of the depletion region in the channel and thereby increases the punchthrough voltage. The source/drain junction capacitance is reduced and the channel mobility is increased so that device performance is improved. This method of forming an anti-punchthrough region can be applied to sub-half micron devices. The invention can be used for both N channel and P channel MOSFET devices, and for either LDD (light doped drain) or non-LDD devices.

DESCRIPTION OF THE PREFERRED EMBODIMENTS

Figure 1:
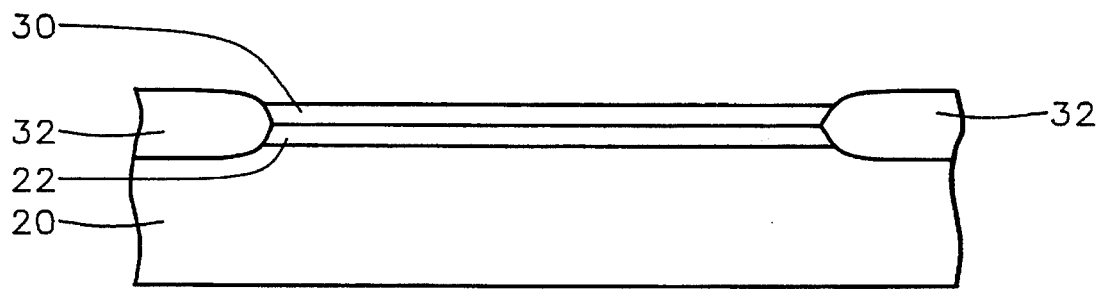
FIG. 1 is a cross section view of an integrated circuit wafer with the field oxide formed to define the device boundaries, the gate oxide formed on the surface of the silicon substrate, and the threshold voltage adjustment region formed with ion implantation.
Figure 2:
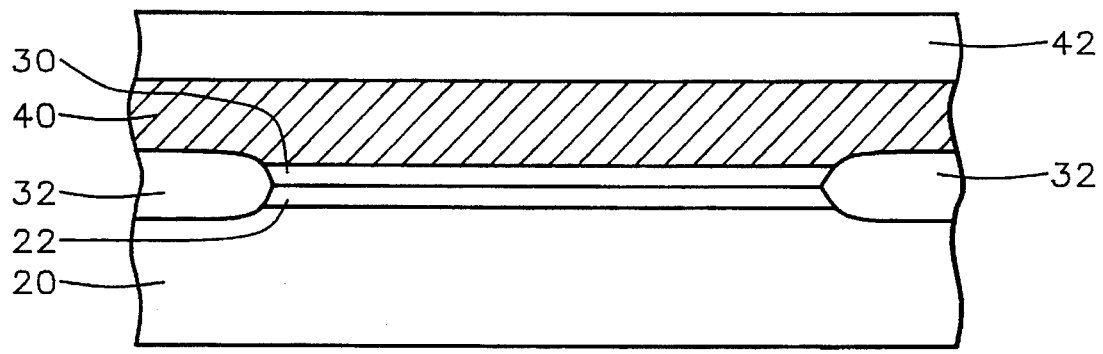
FIG. 2 is a cross section view of an integrated circuit wafer with a polysilicon layer formed on the gate oxide layer and a nitride layer formed on the polysilicon layer.

Refer now to FIG. 1 through FIG. 7, there is shown an embodiment of a method of forming a self-aligned anti-punchthrough region for a MOSFET device. The anti-punchthrough region can be formed in either an N channel or a P channel MOSFET. FIG. 1 shows a cross section of the device with a threshold voltage adjustment ion concentration region 22 formed in a silicon substrate 20 near the surface by means of ion implantation. For an N channel MOSFET a $P^-$ silicon substrate or device well and a $P^-$ threshold voltage adjustment concentration is used. For a P channel MOSFET an $N^-$ silicon substrate or device well is used. Field oxide regions 32 separate adjacent devices wells and a gate oxide layer 30 is formed on the substrate surface. As shown in FIG. 2 a layer of polysilicon 40 with a thickness of between about 0.1 microns and 0.5 microns is formed on the layer of gate oxide 30. A layer of nitride, such as SiN, 42 with a thickness of between about 0.1 microns and 0.5 microns is formed on the layer of polysilicon 40.

Figure 3:
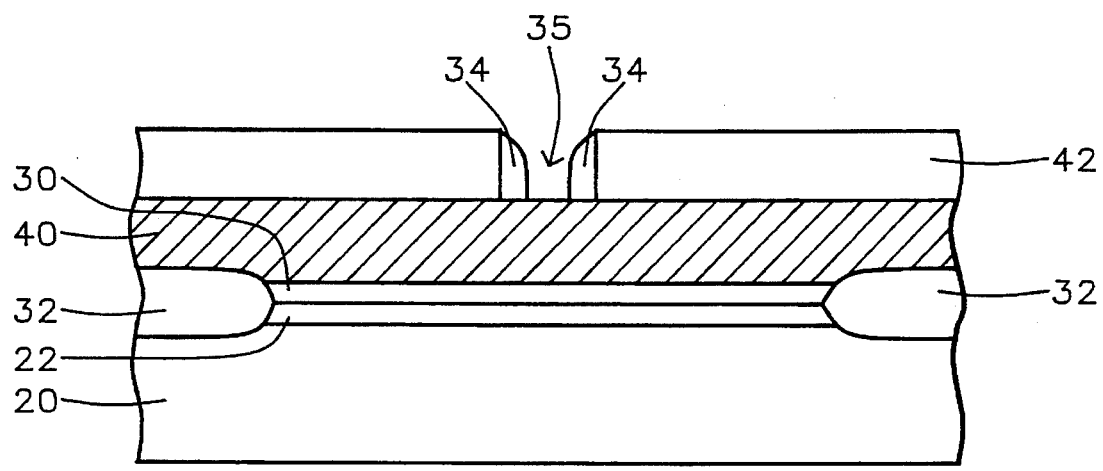
FIG. 3 is a cross section view of an integrated circuit wafer with the gate electrode opening formed in the nitride layer and the first oxide spacer formed on the sidewalls of the gate electrode opening.
Figure 4:
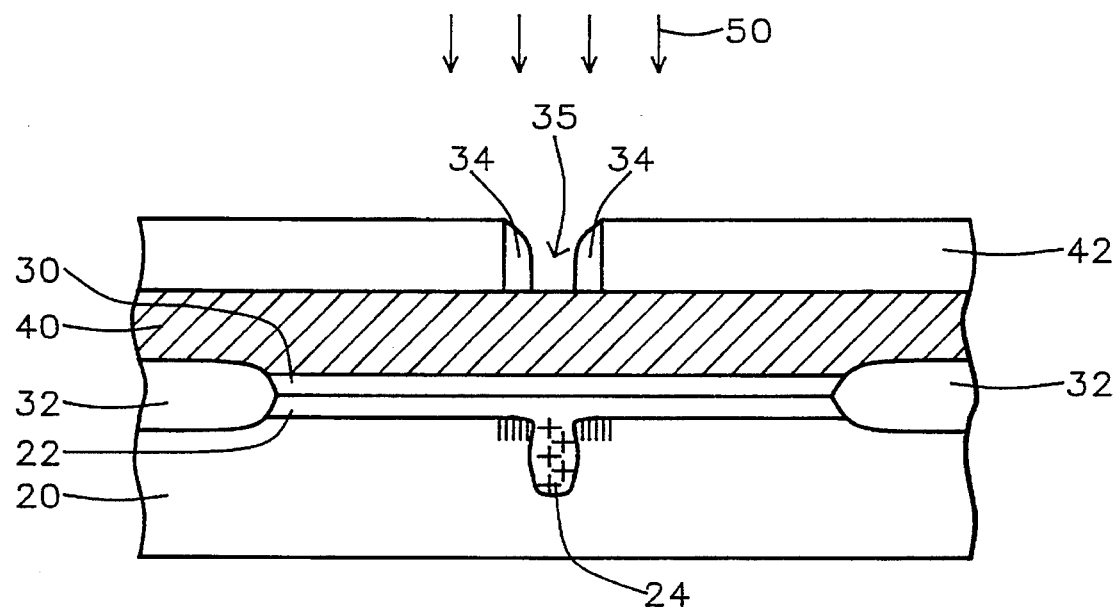
FIG. 4 is a cross section view of an integrated circuit wafer showing the ion implant formation of the self-aligned anti-punchthrough region.

Next as shown in FIG. 3 a gate electrode opening 35 is etched in the layer of SiN by means of dry etching and standard lithographic techniques. A first oxide spacer 34 is then formed on the sidewalls of the gate electrode. The first oxide spacer is formed by depositing a layer of oxide, such as $SiO_2$, over the surface of the layer of SiN with the gate electrode opening formed. The $SiO_2$ is then vertically anisotropically etched using conventional methods. Examples of such etching methods are described in the book "VLSI TECHNOLOGY" Second Edition, by S. M. Sze, published by McGraw-Hill Book Co., New York, N.Y., 1988, Pages 221–226. Next, as shown in FIG. 4, the local anti-punchthrough region 24 is formed by ion implantation using the gate electrode opening 35 in the nitride layer 42 and the first oxide spacer 34 as a mask. FIG. 4 shows a $P^-$ anti-punchthrough region for an N channel MOSFET as an example however the same figure with an $N^-$ anti-punchthrough region applies to a P channel MOSFET. The first oxide spacer 34 controls the width of the anti-punchthrough region 24. For an N channel MOSFET the $P^-$ anti-punchthrough region 24 is formed using ion implantation with a boron ion beam 50 of between about $5 \times 10^{12}$ and $1.5 \times 10^{13}$ ions/cm$^2$ at between about 50 and 200 keV. For a P channel MOSFET the $N^-$ anti-punchthrough region 24 is formed using ion implantation with a phosphorous ion beam 50 of between about $1 \times 10^{12}$ and $1 \times 10^{13}$ ions/cm$^2$ at between about 100 and 250 keV.

Figure 5:
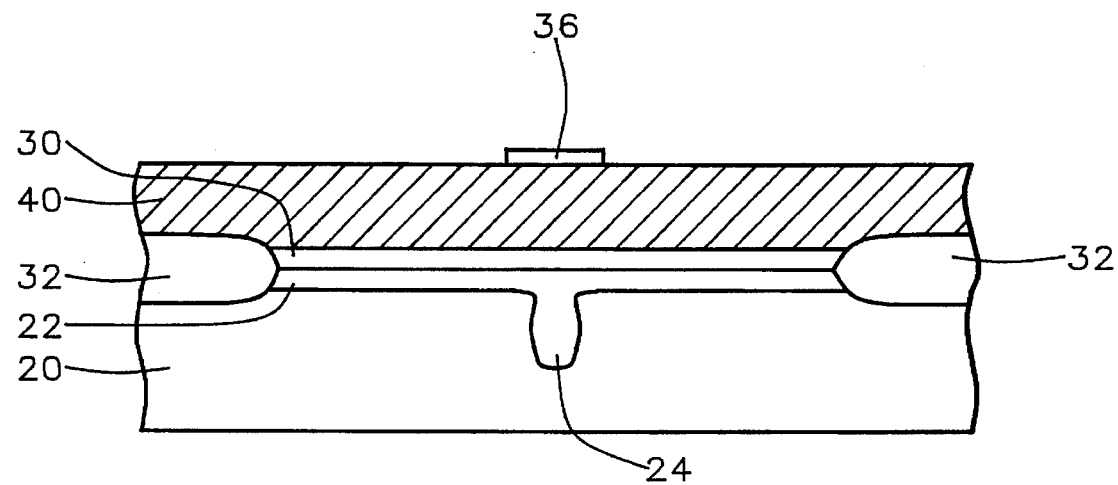
FIG. 5 is a cross section view of an integrated circuit wafer after the nitride layer has been stripped showing the layer of polysilicon oxide formed on the polysilicon layer.
Figure 6:
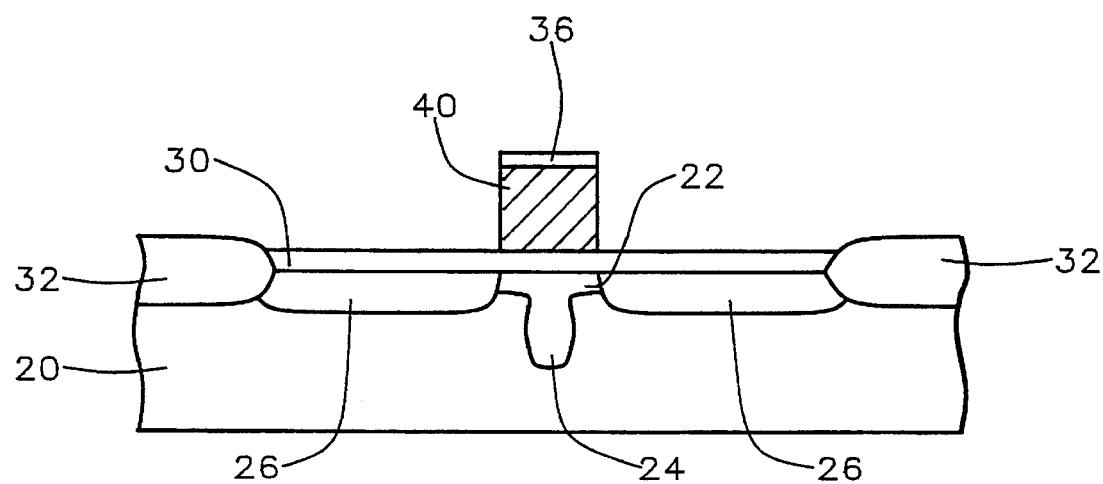
FIG. 6 is a cross section view of an integrated circuit wafer after the gate electrode has been formed and the first source/drain concentration has been formed in the source/drain region.

Next the first oxide spacer is etched away using conventional methods and a polysilicon oxide layer is formed on that part or the polysilicon layer exposed by the gate electrode opening in the nitride layer. The polysilicon oxide is formed by means of thermal growth using the gate electrode opening in the nitride layer as a mask. Next, as shown in FIG. 5, the nitride layer is removed using conventional etching methods and the polysilicon oxide 36 remains on the polysilicon layer. Next, as shown in FIG. 6, the polysilicon not covered by the polysilicon oxide 36 is etched away by means of dry etching using the polysilicon oxide 36 as a mask thereby forming the polysilicon gate electrode 40. Examples of such etching methods are described in the previously cited book by S. M. Sze, Pages 221–226. The polysilicon gate electrode and the anti-punchthrough region are self-aligned with the gate electrode opening in the nitride layer.

Next, as shown in FIG. 6, the light doped drain concentration region 26 is formed using conventional lithography and ion implantation techniques. For an N channel MOSFET the light doped drain concentration region is $N^-$ formed using an ion beam of phosphorous (or arsenic) of between about $1 \times 10^{13}$ and $1 \times 10^{14}$ ions/cm$^2$ at between about 25 and 80 keV. For a P channel MOSFET the light doped drain concentration region is $P^-$ formed using an ion beam of boron (or $BF_2^+$) of between about $1 \times 10^{13}$ and $1 \times 10^{14}$ ions/cm$^2$ at between about 15 and 70 keV.

Figure 7:
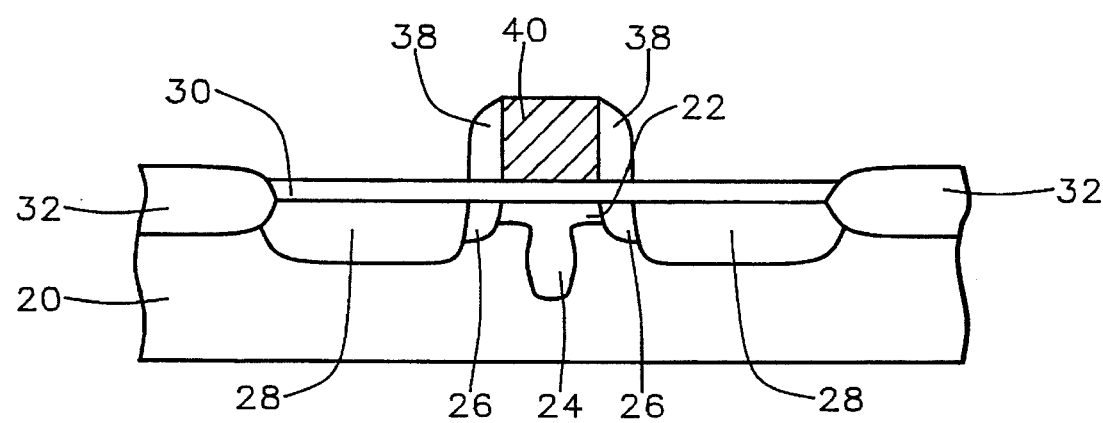
FIG. 7 is a cross section view of an integrated circuit wafer after the second oxide spacer has been formed on the sidewalls of the gate electrode, the second source/drain concentration has been formed directly below second oxide spacer, and the layer of polysilicon oxide has been removed from the gate electrode using overetching as the second oxide spacer is formed.

Next, as shown in FIG. 7, a second oxide spacer 38 is formed on the sidewalls of the polysilicon gate electrode 40. The second oxide spacer is formed by depositing a layer of oxide, such as $SiO_2$, over the surface of the wafer and then vertically anisotropically etched using conventional methods. This etching step is continued long enough to remove the polysilicon oxide layer. An example of such a conventional method is described in the previously cited book "VLSI TECHNOLOGY" Second Edition, by S. M. Sze, Pages 221–226. Next the main source/drain concentration region 28 is formed using conventional lithography and ion implantation methods. The second oxide spacer 38 forms a mask to define the edge of the main source/drain concentration region 28. For an N channel MOSFET the main source/drain concentration region is $N^+$ formed using an ion beam of arsenic of between about $1 \times 10^{15}$ and $5 \times 10^{15}$ ions/cm$^2$ at between about 30 and 80 keV. For a P channel MOSFET the main source/drain concentration region is $P^+$ formed using an ion beam of boron (or $BF_2^+$) of between about $1 \times 10^{15}$ and $5 \times 10^{15}$ ions/cm$^2$ at between about 15 and 60 keV. All of the critical areas of the device are self-aligned to the gate electrode opening in the nitride layer.

Figure 8:
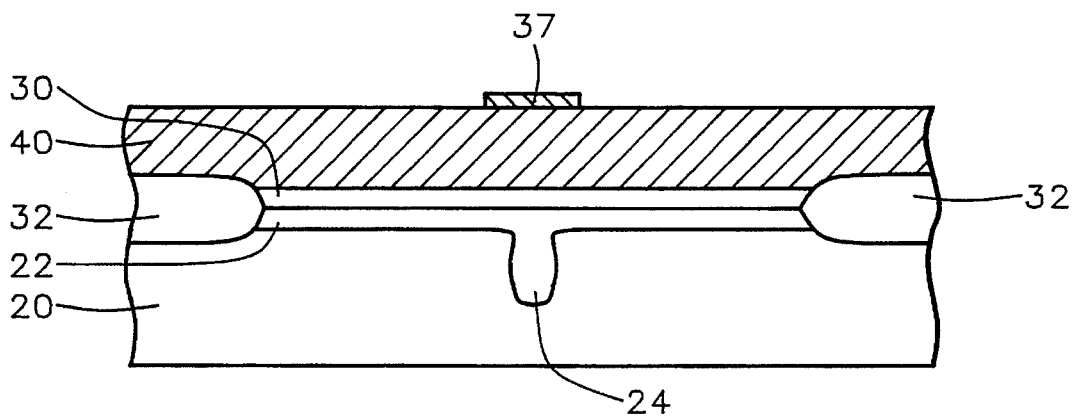
FIG. 8 is a cross section view of an integrated circuit wafer after the nitride layer has been stripped showing the layer of $TiSi_2$ formed on the polysilicon layer.

Refer now to FIG. 1 through FIG. 6 and FIG. 8 through FIG. 10, there is shown another embodiment of forming a self-aligned anti-punchthrough region for a MOSFET device. As in the previous embodiment the anti-punchthrough region can be formed in either an N channel or a P channel MOSFET. The method of this embodiment proceeds the same as for the previous embodiment through the step of forming the anti-punchthrough region 24 with ion implantation and etching away the first oxide spacer 54, shown in FIG. 1 through FIG. 4. Next a layer of Titanium between about 200 and 500 Angstroms thick is sputtered onto the surface of the substrate being formed on the nitride layer and that part of the polysilicon layer exposed by the gate electrode opening in the nitride layer. The wafer is then annealed using rapid thermal process annealing at a temperature of between about 600° C. and 700° C. in nitrogen for between about 10 seconds and 100 seconds. The layer of nitride and titanium nitride is etched away using $NH_4OH:H_2O_2:H_2O$. The wafer is then annealed again using rapid thermal process annealing at a temperature of between about 700° C. and 900° C. in nitrogen for between about 10 seconds and 100 seconds. As shown in FIG. 8 a layer of $TiSi_2$ 37 remains on that part of the layer of polysilicon 40 exposed by the gate electrode opening in the nitride layer.

Figure 9:
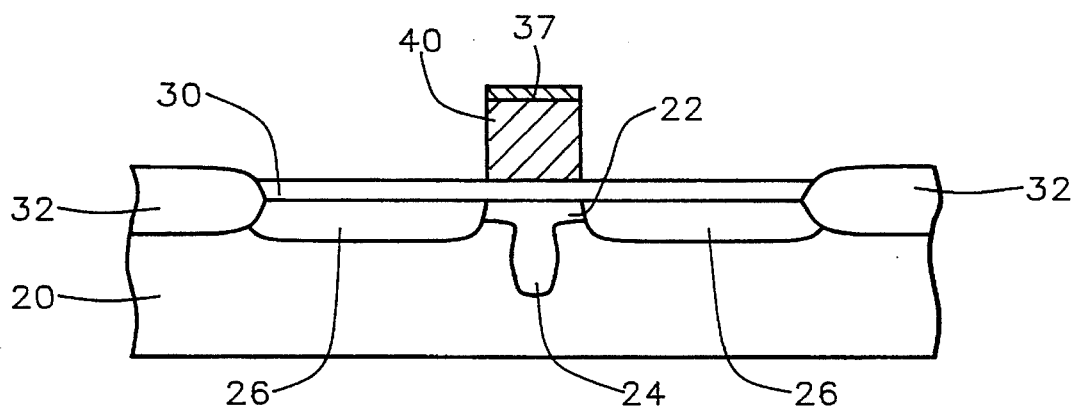
FIG. 9 is a cross section view of an integrated circuit wafer after the gate electrode has been formed and the first source/drain concentration has been formed in the source/drain region.

As shown in FIG. 9, the polysilicon not covered by the $TiSi_2$ 37 is etched away by means of dry etching using the $TiSi_2$ 37 as a mask, thereby forming the polysilicon gate electrode 40. The polysilicon gate electrode and the anti-punchthrough region are self-aligned with the gate electrode opening in the nitride layer.

Next, as shown in FIG. 9, the light doped drain concentration region 26 is formed using conventional lithography and ion implantation techniques. For an N channel MOSFET the light doped drain concentration region is $N^-$ formed using an ion beam of phosphorous (or arsenic) of between about $1 \times 10^{13}$ and $1 \times 10^{14}$ ions/cm$^2$ at between about 25 and 80 keV. For a P channel MOSFET the light doped drain concentration region is $P^-$ formed using an ion beam of boron (or $BF_2^+$) of between about $1 \times 10^{13}$ and $1 \times 10^{14}$ ions/cm$^2$ at between about 15 and 70 keV.

Figure 10:
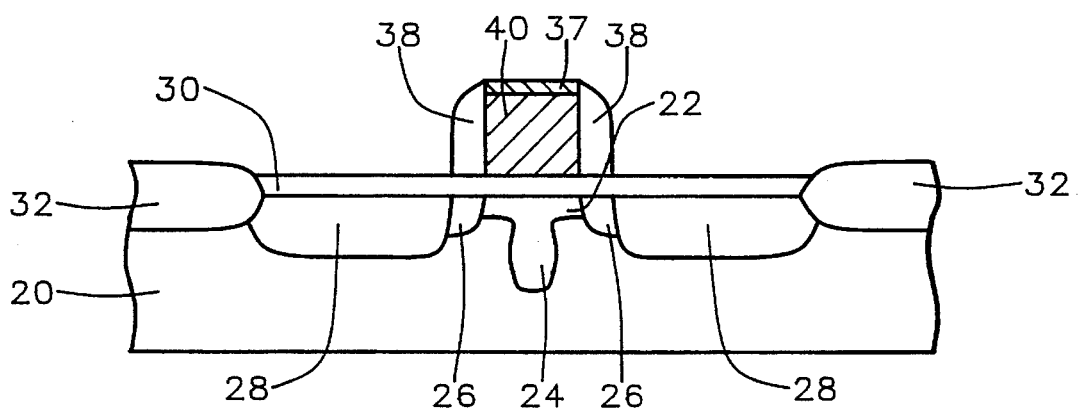
FIG. 10 is a cross section view of an integrated circuit wafer after the second oxide spacer has been formed on the sidewalls of the gate electrode, a layer of $TiSi_2$ has been formed on the gate electrode, and the second source/drain concentration has been formed directly below second oxide spacer.

Next, as shown in FIG. 10, a second oxide spacer 38 is formed on the sidewalls of the polysilicon gate electrode 40. The second oxide spacer is formed by depositing a layer of oxide, such as $SiO_2$, over the surface of the wafer and then vertically anisotropically etched using conventional methods. An example of such a conventional method is described in the previously cited book by S. M. Sze, Pages 221–226. Next the main source/drain concentration region 28 is formed using conventional lithography and ion implantation methods. The second oxide spacer 38 forms a mask to define the edge of the main source/drain concentration region 28. For an N channel MOSFET the main source/drain concentration region is $N^+$ formed using an ion beam of arsenic of between about $1 \times 10^{15}$ and $5 \times 10^{15}$ ions/cm$^2$ at between about 30 and 80 keV. For a P channel MOSFET the main source/drain concentration region is $P^+$ formed using an ion beam of boron (or $BF_2^+$) of between about $1 \times 10^{15}$ and $5 \times 10^{15}$ ions/cm$^2$ at between about 15 and 60 keV. All of the critical areas of the device are self-aligned to the gate electrode opening in the nitride layer.

While the invention has been particularly shown and described with reference to the preferred embodiments thereof, it will be understood by those skilled in the art that various changes in form and details may be made without departing from the spirit and scope of the invention.

What is claimed is:

1. A method for forming a local anti-punchthrough region, comprising the steps of:

providing a silicon substrate having a threshold voltage adjustment concentration formed by ion implantation;

forming a gate oxide layer on the surface of said silicon substrate;

forming a polysilicon layer on the surface of said gate oxide layer;

forming a nitride layer on the surface of said polysilicon layer;

etching a gate electrode opening with sidewalls in said nitride layer;

forming a first oxide spacer on said sidewalls of said gate electrode opening;

forming said local anti-punchthrough region in said silicon substrate directly below said gate electrode opening by means of ion implantation through said gate electrode opening having said first oxide spacer on said sidewalls of said gate electrode opening;

removing said first oxide spacer;

forming a layer of polyoxide on that part of the polysilicon layer directly below said gate electrode opening;

etching away said nitride layer;

forming a polysilicon gate electrode with sidewalls by etching away that part of said polysilicon layer not covered by said layer of polyoxide using said layer of polyoxide as a mask;

forming a second oxide spacer on said sidewalls of said polysilicon gate electrode;

forming a light doped drain source/drain region in said silicon substrate directly below said second oxide spacer; and forming a main source/drain region in said silicon substrate.

2. The method of claim 1 wherein said silicon substrate is $P^-$ type silicon and said local anti-punchthrough region is $P^-$ type silicon.

3. The method of claim 2 wherein said local anti-punchthrough region is formed using a boron ion beam of between about $5 \times 10^{12}$ and $1.5 \times 10^{13}$ ions/cm$^2$ at between about 50 and 200 keV.

4. The method of claim 1 wherein said silicon substrate is $N^-$ type silicon and said local anti-punchthrough region is $N^-$ type silicon.

5. The method of claim 4 wherein said local anti-punchthrough region is formed using a phosphorous ion beam of between about $1 \times 10^{12}$ and $1 \times 10^{13}$ ions/cm$^2$ at between about 100 and 250 keV.

6. The method of claim 1 wherein said silicon substrate is $P^-$ type silicon, said main source/drain region is $N^+$ type silicon, and said light doped drain source/drain region is $N^-$ type silicon.

7. The method of claim 1 wherein said silicon substrate is $N^-$ type silicon, said main source/drain region is $P^+$ type silicon, and said light doped drain source/drain region is $P^-$ type silicon.

8. A method for forming a local anti-punchthrough region, comprising the steps of:

providing a silicon substrate having a threshold voltage adjustment concentration formed by ion implantation;

forming a gate oxide layer on the surface of said silicon substrate;

forming a polysilicon layer on the surface of said gate oxide layer;

forming a nitride layer on the surface of said polysilicon layer;

etching a gate electrode opening with sidewalls in said nitride layer;

forming a first oxide spacer on said sidewalls of said gate electrode opening;

forming said local anti-punchthrough region in said silicon substrate directly below said gate electrode opening by means of ion implantation through said gate electrode opening having said first oxide spacer on said sidewalls of said gate electrode opening;

removing said first oxide spacer;

forming a layer of $TiSi_2$ on that part of the polysilicon layer directly below said gate electrode opening;

etching away said nitride layer;

forming a polysilicon gates electrode with sidewalls by etching away that part of said polysilicon layer not covered by said layer of $TiSi_2$ using said layer $TiSi_2$ as a mask;

forming a second oxide spacer on said sidewalls of said polysilicon gate electrode;

forming a light doped drain source/drain region in said silicon substrate directly below said second oxide spacer; and forming a main source/drain region in said silicon substrate.

9. The method of claim 8 wherein said silicon substrate is $P^-$ type silicon and said local anti-punchthrough region is $P^-$ type silicon.

10. The method of claim 9 wherein said local anti-punchthrough region is formed using a boron ion beam of between about $5 \times 10^{12}$ and $1.5 \times 10^{13}$ ions/cm$^2$ at between about 50 and 200 keV.

11. The method of claim 8 wherein said silicon substrate is N$^-$ type silicon and said local anti-punchthrough region is N$^-$ type silicon.

12. The method of claim 11 wherein said local anti-punchthrough region is formed using a phosphorous ion beam of between about $1 \times 10^{12}$ and $1 \times 10^{13}$ ions/cm$^2$ at between about 100 and 250 keV.

13. The method of claim 8 wherein said silicon substrate is P$^-$ type silicon, said main source/drain region is N$^+$ type silicon, and said light doped drain source/drain region is N$^-$ type silicon.

14. The method of claim 8 wherein said silicon substrate is N$^-$ type silicon, said main source/drain region is P$^+$ type silicon, and said light doped drain source/drain region is P$^-$ type silicon.

15. The method of claim 8 wherein said layer of TiSi$_2$ is formed by sputtering a layer of titanium on said silicon substrate followed by rapid thermal process annealing.

16. The method of claim 15 wherein said layer of titanium is between about 200 and 500 Angstroms thick.

17. The method of claim 15 wherein said rapid thermal process annealing is carried out at temperatures of between about 600° C. and 700° C. for between about 10 seconds and 100 seconds in nitrogen followed by temperatures of between about 700° C. and 900° C. for between about 10 seconds and 100 seconds in nitrogen.

* * * * *